United States Patent [19]

Cagan et al.

[11] Patent Number: 4,649,495

[45] Date of Patent: Mar. 10, 1987

[54] PROCESS AND DEVICE FOR MEASURING THE INITIAL PERMEABILITY OF FERRIMAGNETIC MATERIALS OVER A WIDE FREQUENCY BAND

[75] Inventors: Vladimir Cagan, Paris; Marcèl Guyot, Epernon, both of France

[73] Assignee: Centre National de la Recherche Scientifique (CNRS), Paris, France

[21] Appl. No.: 636,827

[22] Filed: Aug. 1, 1984

[30] Foreign Application Priority Data

Aug. 8, 1983 [FR] France ................................ 83 13042

[51] Int. Cl.$^4$ ..................... G01N 27/72; G01R 33/12; G06F 15/32
[52] U.S. Cl. ................................... 364/481; 324/211; 324/224; 324/239
[58] Field of Search ............... 324/201, 211, 224, 233, 324/239, 377; 364/480, 481

[56] References Cited

U.S. PATENT DOCUMENTS

| 2,985,300 | 5/1961 | Boehm et al. | 209/568 |
| 3,281,668 | 10/1966 | Rosner et al. | 324/224 |
| 3,528,001 | 9/1970 | Yntema | 324/224 |
| 3,720,870 | 3/1973 | Sueda | 324/239 |
| 4,105,971 | 8/1978 | Nevalainegn | 324/224 X |
| 4,551,681 | 11/1985 | Seeley | 324/224 X |

FOREIGN PATENT DOCUMENTS 893550 10/1953 Fed. Rep. of Germany .
2125167 9/1972 France .

OTHER PUBLICATIONS

"An Apparatus for the Measurement of Initial Magnetic Permeability as a Function of Temperature" by Cedillo et al: J. Phys. E. Sci. Instrument, vol. 13, 1980, pp. 383–386.

"Primary Transducers for Measurement if the Parameters of Magnetic Materials at hf" by Simkin et al: Measurement Techniques, vol. 24, No. 3, Mar. 1981, pp. 242 and 243.

Primary Examiner—Felix D. Gruber
Attorney, Agent, or Firm—Arthur B. Colvin

[57] ABSTRACT

According to the process, a toroidal sample of ferrimagnetic material to be analyzed is placed in a thermostatically-controlled enclosure fitted with temperature regulation and detection means. The toroidal sample is submitted to an electro-magnetic magnetizing field of given frequency and the flux induced in the sample is measured directly using a measuring loop, around the sample and which is connected to a vectorial voltmeter.

12 Claims, 6 Drawing Figures

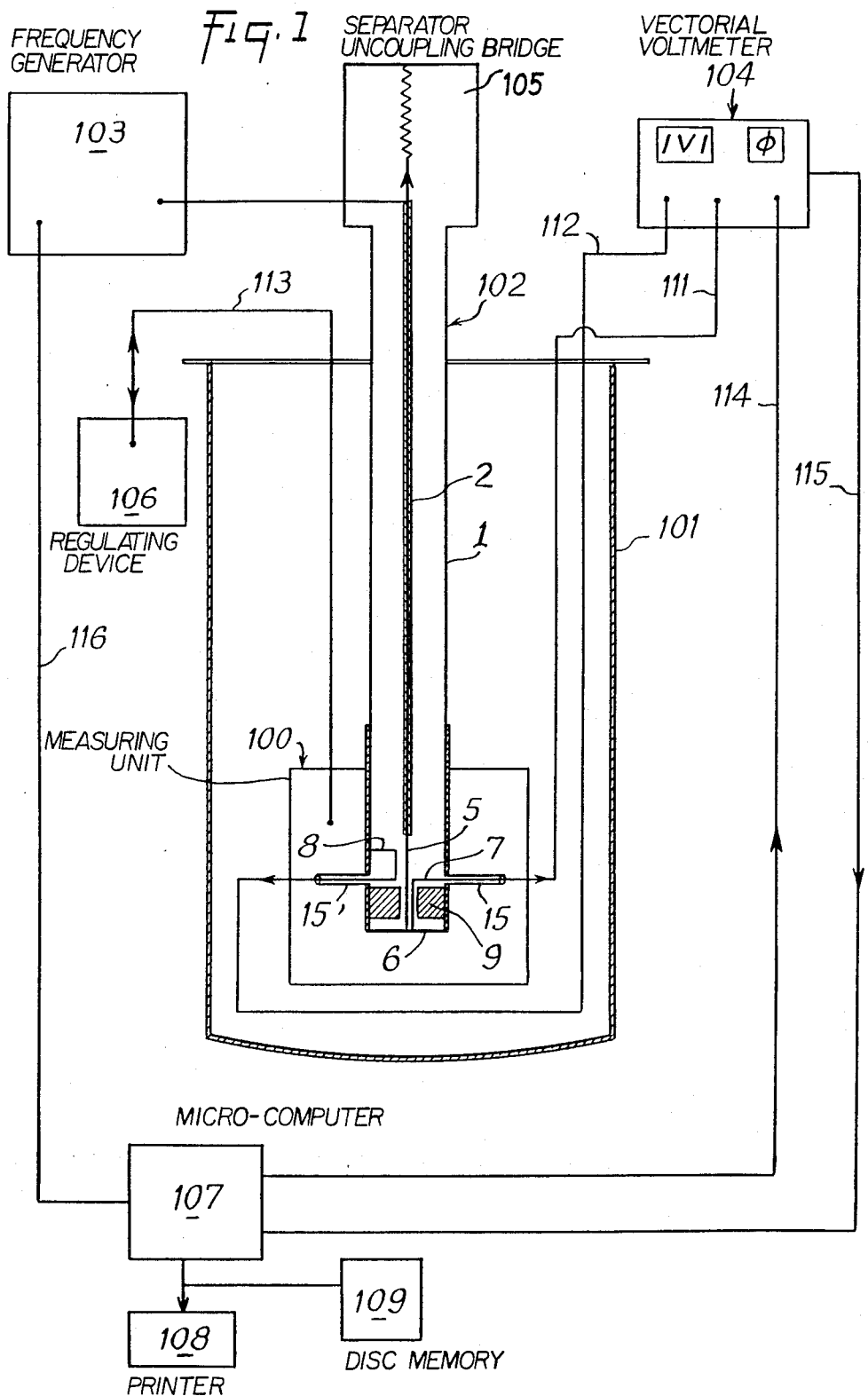

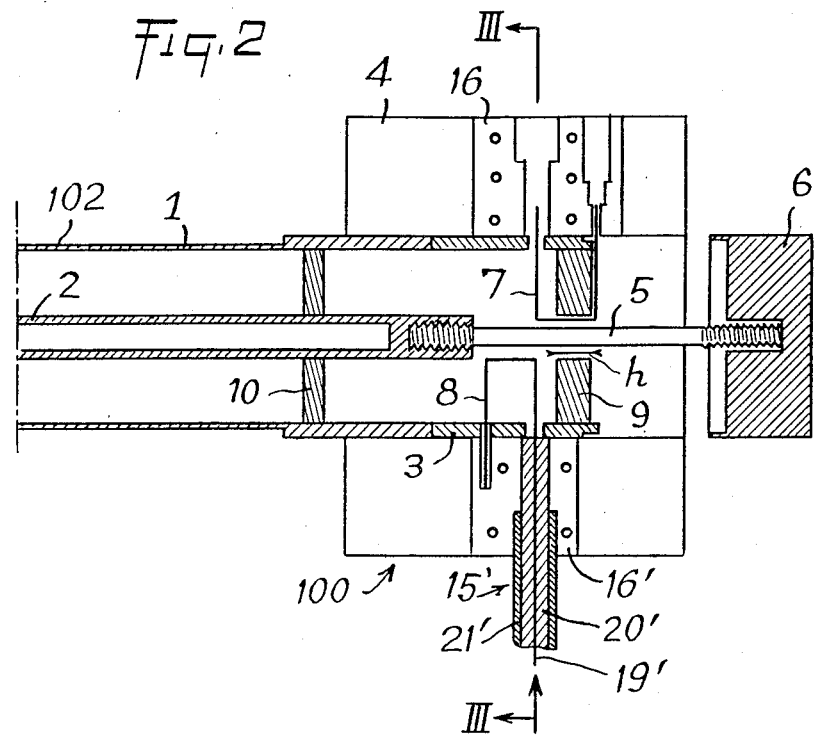
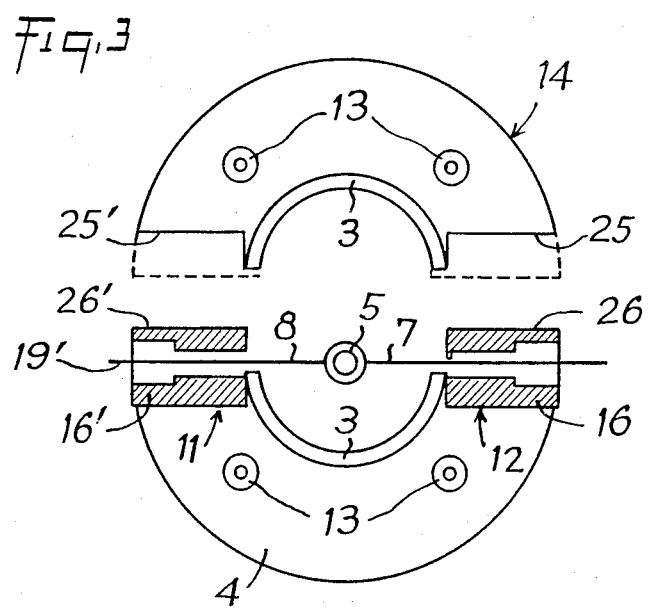

PROCESS AND DEVICE FOR MEASURING THE INITIAL PERMEABILITY OF FERRIMAGNETIC MATERIALS OVER A WIDE FREQUENCY BAND

BACKGROUND OF THE INVENTION

1. Field of the Invention

The present invention relates to a process and device for measuring the initial permeability of ferrimagnetic materials over a large frequency band, as a function of temperature.

2. Description of the Prior Art

Fundamental and applied research on ferrimagnetic materials used in the area of electronics and telecommunications require determination of the frequency spectrum of the initial permeability as a function of temperature, the initial permeability corresponding to a tangent to the origin of the first magnetizing curve.

Such determination is traditionally performed by measuring impedance on circuits with localized constants or distributed constants depending on the frequency range considered.

At the bottom of the frequency range, these measurements are made by impedance bridges; the range 50 Hz to 160 MHz can be covered by using several different instruments. Such measurements using bridges are in any case long and meticulous, furthermore, when working as a function of temperature, the connection obligations due to the use of a cryostatic system means that the measurements become very difficult if not impossible, above a few tenths of MHz.

Above 160 MHz, impedance is measured by hyperfrequency methods: admittance bridge or split line. It is nearly impossible to adapt these very long and delicate measurements to thermal variations.

SUMMARY OF THE INVENTION

The present invention is intended to remedy the above drawbacks and to allow measurements to be made simply and rapidly over a very wide frequency band that may reach several gigahertzs, allowing easy estimation of the initial relative permeability of ferrimagnetic materials.

The invention also relates to a process and a device adapted to allow measurements to be carried out as a function of temperature.

The invention is also intended to provide a measuring process which lends itself easily to automatization.

These features are furnished by means of a measuring process by which, in accordance with the invention, a toroidal sample of ferrimagnetic material to be analyzed is placed in a thermostatically-controlled enclosure fitted with temperature detection and regulation means; the toroidal sample is submitted to an electro-magnetic magnetizing field of given frequency and the flux induced in the sample sensed directly by a measuring loop that surrounds the sample and which is connected to a vectorial voltmeter.

More particularly, when measuring the initial permeability of ferrimagnetic materials in a frequency range between a few megahertzs and a few gigahertzs, a reference toroidal sample of non-magnetic material and of low dielectric constant is placed inside a coaxial line, coaxially between the central conductor and the outside conductor, upstream of an end short circuit; a phase reference loop is placed in the coaxial line in the immediate proximity of the reference sample, but outside it; a vectorial voltmeter is used to read the voltage Ao on the reference loop, the voltage Bo on the measuring loop around the reference loop and the phase shift between the voltages Ao and Bo, for each given frequency of the electromagnetic field; the reference toroidal sample is replaced by a toroidal sample of the ferrimagnetic material to be analyzed of the same outside diameter as the reference toroidal sample and a vectorial voltmeter is again used to read voltage A1 on the reference loop, voltage B1 on the measuring loop around the sample of ferrimagnetic material to be analyzed and the phase shift between voltages A1 and B1, for each given frequency of the electromagnetic magnetizing field applied to the coaxial line; the real and imaginary components $\mu'$ and $\mu''$ of the complex relative initial permeability of the ferrimagnetic material are determined from the formulas:

$$\mu' = \frac{Ao}{Bo} \times \frac{B1}{A1} \cdot K \cdot \cos(\phi_1 - \phi_0)$$

and $$\mu'' = \frac{Ao}{Bo} \times \frac{B1}{A1} \cdot K \cdot \sin(\phi_1 - \phi_0)$$

where K is a dimensionless coefficient equal to or greater than 1, said coefficient representing the ratio between the surface area of the measuring loop (7) and the area of the cross-section of the toroidal sample (9).

To measure the initial permeability of ferrimagnetic materials in a frequency range between a few hertzs and a few megahertzs, an electric magnetizing wire is placed axially through the toroidal sample of the magnetic material to be analyzed and a vectorial voltmeter is used to read for each frequency F of the signal applied to the electric magnetizng wire, the components in phase V''' and in quadrature V' of the electromotive force measured on the measuring loop consisting of a winding with N turns and also the reference voltage Vo measured at the terminals of an impedance load Z connected between said electric magnetizing wire and the ground, and the real and imaginary components $\mu'$ and $\mu''$ of the relative initial permeability of the ferrimagnetic material are determined from the formulas:

$$\mu' = \frac{V'}{Vo}\left[\frac{Z \cdot 10^{11}}{4\pi F \cdot N \cdot h \cdot \text{Log}\frac{D}{d}}\right]$$

$$\mu'' = \frac{V''}{Vo}\left[\frac{Z \cdot 10^{11}}{4\pi F \cdot N \cdot h \cdot \text{Log}\frac{D}{d}}\right]$$

where h represents the length of the sample in meters, D and d respectively represent the outside and inside diameters of the toroidal sample and Z represents the impedance load in ohms.

The device according to the invention, which provides for measuring the initial permeability of ferrimagnetic materials in a frequency range between a few megahertzs and a few gigahertzs, as a function of temperature, comprises a measuring unit located inside a thermostatically-controlled enclosure and connected (a) to a principal coaxial line fed from a frequency generator, (b) to two secondary coaxial connecting cables which are connected to a vectorial voltmeter and (c) to conductors which are connected to a temperature regulation and measuring circuit for measuring and regulating the temperature of the measuring unit. The measuring unit comprises two semi-cylindrical massive metallic half-shells which are located at the end of the principal coaxial line and are in contact with the outside conductor or an extension of the outise conductor. Means are provided to short circuit the end of the principal coaxial line in the measuring unit. A detectable measuring loop placed in the unit near the short circuiting means is connected to the central conductor of one of the said secondary coaxial connecting cables. A reference loop placed in the unit near the detachable measuring loop and having dimensions close to those of the measuring loop is connected to the central conductor of the other of said secondary coaxial connecting cables. The detachable measuring loop is formed so that it can surround a toroidal sample of ferrimagnetic material to be analyzed introduced in the unit coaxially to the principal coaxial line, near the short circuiting means, while being in contact exclusively with the outside conductor of the principal coaxial line.

Heating resistors connected to the temperature regulation measuring circuit and fed with d.c. current are placed in each of the two cylindrical half-shells, parallel to the axis of the principal coaxial line and temperature measuring sensors are also placed in said half-shells and are connected to said temperature measuring and regulation circuit.

The length "h" of a torroidal sample that can be placed in the measuring unit near the short circuiting means is of the order of a few millimeters and, in any case, much less than one-quarter of the wave length of the electromagnetic field existing in the principal coaxial line.

In order to reduce heat losses in the part outside the measuring unit, the thickness of the outside conductor of the principal coaxial line is reduced.

To protect the frequency generator, a decoupling bridge can be interposed between the principal coaxial line and the frequency generator.

Preferably, the reference loops and the measuring loop are fixed in first and second cable-clamping blocks respectively that hold the ends of the secondary coaxial cables connecting to the vectorial voltmeter and the outside conductor of each secondary coaxial cable is in contact with the half-shells while the central conductor of each secondary coaxial cable is insulated and connected to a female connector that holds one end of the loop.

Advantageously, the device according to the invention comprises a micro-computer connected to the frequency generator and to the vectorial voltmeter to automatically control the measuring and recording of the permeability of one sample as a function of frequency at a given temperature.

In general, the invention allows improved relative sensitivity at hyperfrequencies (frequencies higher than about 100 MHz) because the measurement is made of the sample only and not of the whole measuring line. This is a great advantage for measurements in relation to temperature because it frees the measurement from the effect of thermal variations on the line itself, which can make any significant measurement impossible by traditional measuring methods.

It is also noteworthy that, according to the invention, adjustment of the size of the sample to the coaxial line is not a critical point, as in the case of traditional measurements, thus eliminating a major source of errors.

Moreover, at lower frequencies, of the order of a few megahertzs to about 100 MHz, the process and the device according to the invention allow measurements to be made even if the connecting conductors are relatively long, which is the case when measurements have to be carried out as a function of temperature. On the other hand, the traditional methods based on bridges are practically useless when the influence of the conductors becomes preponderant.

Other characteristics and advantages will appear from the description that follows the information on particular methods of implementing the invention, in reference to the drawings appended in which: cl BRIEF DESCRIPTION OF THE DRAWINGS FIG. 1 is a schematic view of the whole device according to the invention, adapted for measurements of frequency ranges of the order of a few megahertzs to a few gigahertzs, FIG. 2 is a schematic cross-sectional view of a measuring unit that can be used in the device of FIG. 1, FIG. 3 is a cross-sectional view along line III—III of FIG. 2, FIG. 4 is an enlarged view of part of the unit of FIG. 2, showing the connection of the measuring loop, FIG. 5 is a cross-sectional view along line V—V of FIG. 4, and FIG. 6 is a schematic view of a measuring device adapted to frequencies less than about 10 MHz.

DETAILED DESCRIPTION OF PREFERRED EMBODIMENTS

Figure 4:
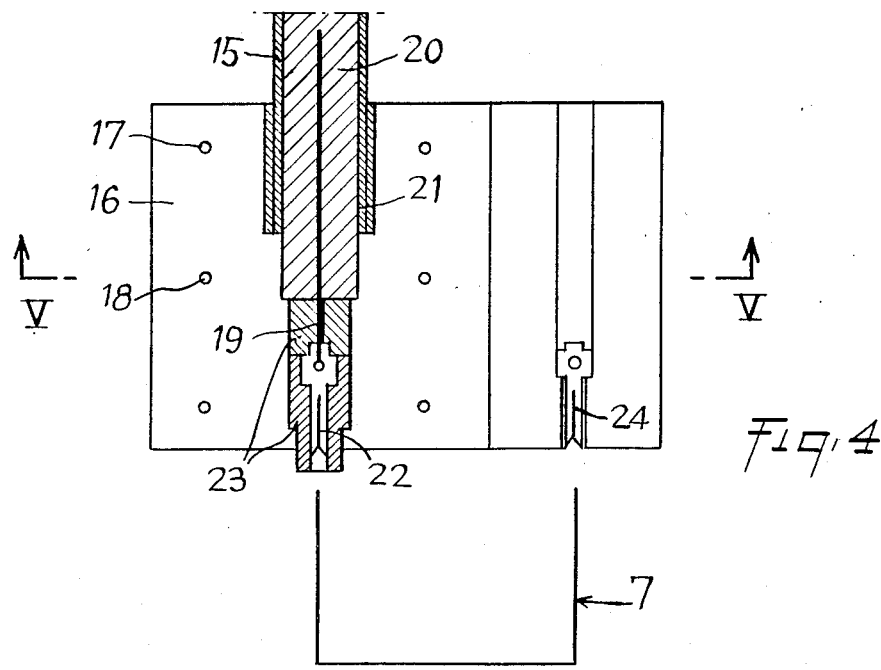
Figure 5:
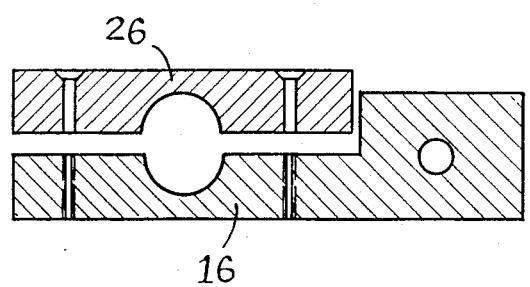

In general, the process of measuring the initial permeability of a ferrimagnetic material at frequencies between about 5 to 2000 MHz consists, according to the invention, of directly measuring the flux induced in a toroidal sample 9 placed upstream of a short circuit 6 at the end of a coaxial line 102 using a measuring loop 7 around ferrimagnetic sample 9 (FIG. 1). The signal from the measuring loop 7 is applied by a measuring line 15, 111 to a vectorial voltmeter 104 able to give a reading of the absolute value and of the measured voltage phase. The phase reference is supplied to the vectorial voltmeter 104 by reference line 15', 112, from a reference loop 8 similar to measuring loop 7 and also placed in the coaxial line 102, but outside sample 9 while remaining as near as possible to it. The phase of the reference signal may thus be nearly the same as that of the signal of the measuring loop 7 with no sample in it. The reference loop 8 can naturally be placed in coaxial line 102 with an angular off-set in relation to measuring loop 7. Thus, as can be seen from FIGS. 1 and 2, reference loop 8 is placed at 180° to measuring loop 7. In this case, the off-set of 180° created between reference loop 8 and measuring loop 7 is fixed and can easily be compensated for during measurements by means of the vectorial voltmeter. The basic fact remains that reference loop 8 and measuring loop 7 are at positions as close together as possible along axial conductor 2 of coaxial line 102.

As can be seen from FIG. 1, coaxial line 102 comprises an outside conductor 1 and an axial conductor 2 fed from frequency generator 103. A separator uncoupling bridge 105 is preferably inserted between frequency generator 103 and coaxial line 102 in order to protect generator 103 because the electromagnetic power coming back from the short circuit 6 arrives in the bridge which provides a suitable load.

Measuring unit 100 is placed inside a heat-insulated enclosure 101. Heating resistors and temperature measuring sensors can be directly incorporated in measuring unit 100 in order to control with maximum precision the temperature of sample 9. Conductors 113 provide connection between the heating elements and the temperature measuring and regulation sensors, firstly, and the temperature measuring and regulating device 106, secondly.

The measuring process according to the invention can easily be automatized because the measurements of flux and the calculations of the initial relative permeability of the material of which sample 9 is made can be performed for the whole range of frequencies without manual action. For this purpose, a micro-computer 107 associated with traditional peripherals such as a printer 108 and disk-memory 109 control through line 116 selection of the measurement frequency supplied by the frequency generator 103 and also, through line 114, selection of the relevant measurement range on vectorial voltmeter 104, and receives through line 115 the measurement data supplied by vectorial voltmeter 104 and then carries out the calculations of permeability. Temperature regulation and measuring circuit 106 can be controlled by micro-computer 107 when required.

The measurements carried out by the process according to the invention can be very precise and very reliable. It is noteworthy that the use of coaxial line 102 and of toroidal sample 9 ensures that there is no de-magnetizing field because the geometry of the magnetic field is circular in the coaxial line. Moreover, the position of sample 9 at the end of the coaxial line upstream of short circuit 6 allows sample 9 to be placed in a maximum and fixed magnetic field, increasing sensitivity and reliability because the field amplitude is constant whatever the frequency.

Naturally, the hyperfrequency field must be uniform over the whole cross-section of sample 9. In view of the envisaged frequencies, if the length "h" of sample 9 is a few millimeters, it is in all cases very much less than one-quarter of the wave length of the hyperfrequency field, ensuring uniformity of the field.

There are several possibilities for calculation of components $\mu'$ and $\mu''$ of the initial complex permeability of the ferrimagnetic material studied, based on complex values for the voltage measured at the terminals of measuring loop 7 and reference loop 8 using vectorial voltmeter 104.

When using the assembly illustrated in FIG. 1, a simple calculation can be carried out applying a method of comparison. In a first step, the measuring assembly is calibrated. To this end, a calibrating sample made of a non-magnetic material having a low dielectric constant may be substituted for the sample 9, to be studied. The calibrating sample may be made of, for example, the material known under the registered trademark "Plexiglass". The calibrated sample must advantageously be of the same diameter as the samples being measured to allow correct positioning of measuring loop 7.

During calibration, voltage Ao on reference loop 8, voltage Bo on measuring loop 7 and phase shift $\phi_0$ between voltages Ao and Bo are noted in relation to frequency for each temperature required.

After substituting measuring sample 9 for the calibrated sample, values of the same parameters are read in the same way as a function of frequency for the required temperatures. These parameters become $A_1$ (voltage of reference loop), $B_1$ (voltage of measuring loop) and $\phi_1$ (phase shift between $A_1$ and $B_1$).

The real and imaginary components $\mu'$ and $\mu''$ of the relative complex permeability are then calculated from the following formulas:

$$\mu' = \frac{Ao}{Bo} \times \frac{B1}{A1} \cdot K \cdot \cos(\phi_1 - \phi_0) \tag{1}$$

$$\mu'' = \frac{Ao}{Bo} \times \frac{B1}{A1} \cdot K \cdot \sin(\phi_1 - \phi_0) \tag{2}$$

where K is a dimensionless coefficient equal to or greater than 1, said coefficient representing the ratio between the surface area of the measuring loop (7) and the area of the cross-section of the toroidal sample (9).

The correction coefficient K allows correction of measurements made with toroidal samples that do not entirely fill measuring loop 7.

It is noteworthy that the above method is very precise for the determination of relative values of permeability in relation to temperature or frequency, and is only limited by the sensitivity of the vectorial voltmeter.

Figure 6:
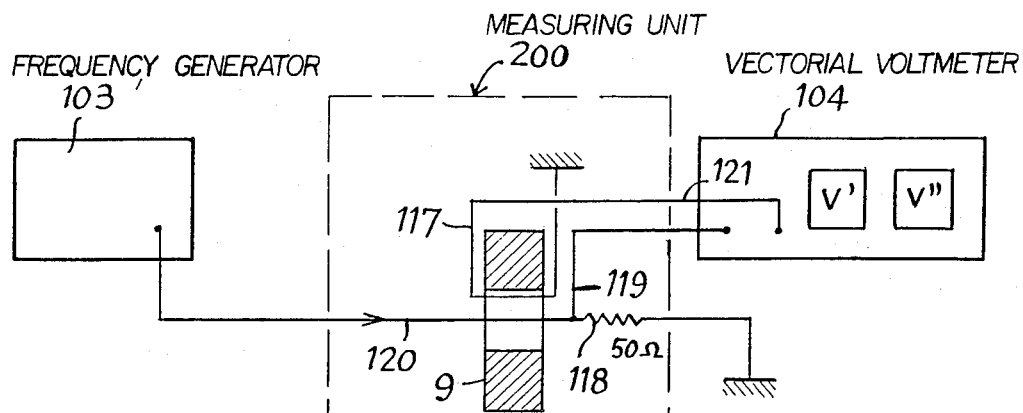

FIG. 6 illustrates schematically another method of assembly adapted to the measuring of the initial permeability of a ferrimagnetic material at frequencies between 2 Hz and about 5 MHz. A toroidal sample 9 similar to the sample 9 in FIG. 1 is again used in this case and the flux in this sample is measured by measuring loop 117 surrounding sample 9. Measurement unit 200 is also fitted with a means, that is not illustrated, of measuring and regulating the temperature and is placed in a heat-lagged enclosure similar to enclosure 101 of FIG. 1. Measuring instruments associated with unit 200 are, as in the case of FIG. 1, a frequency generator 103 and a vectorial voltmeter 104 to which can be added a micro-computer that controls the measurements as in the diagram of FIG. 1.

The basic differences between the assembly of FIG. 1 and that of FIG. 6 lie in the fact that the toroidal sample 9 of the latter is no longer placed in a coaxial line but is simply crossed by an electric magnetization wire 120 fed by frequency generator 103, and that the measuring loop 117 connected to vectorial voltmeter 104 consists of a winding with a number of turns N that may be greater than 1. Moreover, the phase reference simply consists of a connection to the magnetizing wire 120 near sample 9 and upstream of a suitable load 118, for example, 50 ohm, of which the other end is connected to ground. Load 118 thus corresponds to the impedance of coaxial line 102 of the FIG. 1 which may be, for example, 50 ohm.

In the case of the assembly shown in FIG. 6, it is possible to use the rigorous calculation of flux induced in the sample to determine the real and imaginary components $\mu'$ and $\mu''$ of the complex relative permeability $\mu$, from the following formulas:

$$\mu' = \frac{V'}{Vo} \left[ \frac{Z \cdot 10^{11}}{4\pi F \cdot N \cdot h \cdot \text{Log} \frac{D}{d}} \right] \tag{3}$$

$$\mu'' = \frac{V''}{Vo} \left[ \frac{Z \cdot 10^{11}}{4\pi F \cdot N \cdot h \cdot \text{Log} \frac{D}{d}} \right] \tag{4}$$

where F is the frequency in hertz of the signal delivered by generator 103, N is the number of turns of winding 117, h is length of sample 9 in meters, D and d respectively represent the outside and inside diameters of toroidal sample 9, Z represents impedance of load 118, Vo is reference voltage at terminals of load 118, measured by line 119, and V' and V" are respectively the components in phase and in quadrature of the voltage measured on measuring line 121 connecting measuring loop 117 to vectorial voltmeter 104.

The formulas (3) and (4) relating to the intial relative permeability $\mu = \mu_i/\mu_o$ where $\mu_o$ is the vacuum permeability and $\mu_i$ is the initial permeability determined by the ratio of the magnetic induction B (in teslas) to the magnetic field applied H (in amperes/meter) corresponding to the tangent to the origin of the first magnetization curve.

Follows a more detailed description, referring to FIGS. 2 to 5, of the structure of a measuring unit 100 that can be used in the assembly illustrated in FIG. 1 adapted to measurements of high frequency.

Coaxial cable 102 can be a traditional air-insulated coaxial cable with an outside conductor 1 and a cylindrical inside conductor 2, a centering piece 10 in dielectric ceramic inserted between central conductor 2 and outside conductor 1 near to measuring unit 100. Coaxial cable 102 can be a cable suited to operate over wide temperature ranges, e.g., from 4° K. to 1000° K. To minimize heat losses, inside conductor 2 is hollow and outside conductor 1 is thin over that part of cable 102 located outside measuring unit 100.

Measuring unit 100 itself comprises two semi-cylindrical massive metal half-shells 4, 14, of rigorously identical dimensions so that they form when assembled a cylinder which is perfect on the inside. The end of non-reduced axial cable 102 is inserted between half-shells 4, 14, of which one constitutes the base of the unit in which can be installed the sample while the other constitutes the cover. A pair of semi-cylindrical parts 3 of the same thickness and diameter as the non-reduced outside conductor 1 of coaxial cable 102 are placed in the massive semi-cylindrical shells 4, 14 downstream of coaxial cable 102 to form an extension of it. A detachable rod 5 of diameter slightly less than that of inside conductor 2 is added to the end of inside conductor 2 extending it at the pair of semi-cylindrical parts 3 that constitute extension of outside conductor 1. A monobloc cylindrical part 6 can be screwed to the end of rod 5 coming into contact with the inside of the central bore of the semi-cylindrical shells 4, 14 and with the free end of semi-cylindrical parts 3 to form a short circuit at the end of coaxial line 102 and its extension consisting of parts 3 and 5.

The toroidal sample 9 is introduced into unit 100 before assembly of rod 5 and of short circuit 6 with its outside side in contact with semi-cylindrical parts 3. The diameter of rod 5 is less than the orifice of toroidal sample 9 so that the latter is not in contact with inside conductor 2, 5 and that measuring loop 7 around sample 9 is not in contact with rod 5.

Two cable-clamping blocks 11, 12, are designed to be fitted in the lower half-shell 4 in order to hold in unit 100 the ends of coaxial cables 15', 15 that respectively connect reference loop 8 and measuring loop 7 to vectorial voltmeter 104. Measuring loop 7 which must be placed around toroidal sample 9 is detachable and consists, for example, of bronze wire. Fixed reference loop 8 consists of the curved end of central conductor 19' of coaxial cable 15'. Coaxial cables 15, 15' can be high temperature cables of impedance 50 ohm comprising a center conductor 19, 19' insulated from an outside conductor 21, 21' by a dielectric material 20, 20'. Outside conductor 21, 21' covered with a protective jacket consists of a braid which is turned over the jacket to provide a contact with ground at the end of cable 15, 15' inserted in cable clamp 12, 11. Central conductor 19 of cable 15 is extended by a female end piece 22 of coaxial connector pipe which is itself isolated from cable clamp 12 and centered in it by insulating parts 23 made of, for example, PTFE (see FIG. 4). Another female end piece 24 of the same type as end piece 22 is crimped in base 16 of the cable clamp at a short distance from end piece 22 to constitute a ground contact for the end of detachable loop 7 of which the other end is inserted in connector 22. Detachable loop 7 can be made of bronze wire, for example, with a diameter of about 0.5 mm. The free end of reference loop 8 which is grounded can be inserted in base 16' of cable clamp 11 in a connector similar to connector 24.

Each cable clamp 12, 11 comprises a cover 26, 26' which is secured by securing holes 18 on base 16, 16' of the cable clamp and holds the end of the relevant cable. Cable-clamp unit 11, 12 is itself secured to the base half-shell 4 by securing holes 17. Half-shell 14 forming a cover is provided with hollows 25, 25' allowing insertion of covers 26, 26' of cable clamps 12, 11, (FIG. 3).

Heating resistors 13 embedded in refractory cement are placed in orifices provided in lower half-shell 4 and upper half-shell 14, parallel to the axis of coaxial cable 102. The heating resistors in the bodies 4, 14 of measuring unit 100 allow a reduction of thermal inertia. Moreover, electric resistors 13 are fed with d.c. current and are placed in relation to the axis of coaxial cable 102 so that they compensate for the extra magnetic fields due to the resistors. Because the overall extra magnetic field created on the axis is nil, the measurement is in no way disturbed by the electric resistors 13. Two sensors which may, for example, be made of platinum are also embedded in bodies 4, 14 of measuring unit 100 to serve for temperature measurement and regulation, with the signals from the sensors transmitted to circuit 106 which controls the feed to resistors 13.

Measuring unit 100 as described is characterized by its ease of assembly and its reliability in measuring fluxes by measuring loop 7.

Of course, a number of modifications and additions may be made to the devices described while applying the same measuring process.

What is claimed is:

1. A process for measuring the initial permeability of ferrimagnetic materials over a wide frequency band as a function of temperature, wherein (a) a toroidal sample of the ferrimagnetic material to be analyzed is placed in a thermostatically-controlled enclosure fitted with temperature detection and regulation means; (b) the toroidal sample is submitted to an electromagnetic magnetization field of given frequency; and (c) the flux induced in the sample is directly measured with a measuring loop located around the sample; (d) a vectorial voltmeter is used to read, for each given frequency of the applied electromagnetic magnetization field, the reference voltage provided at the terminals of a reference component and the voltage on said measuring loop; and (e) the real component $\mu'$ and the imaginary component $\mu''$ of the complex relative initial permeability of the ferrimagnetic material are determined, for each given frequency of the applied electromagnetic magnetization field, from the data read by said vectorial voltmeter.

2. A process according to claim 1 adapted to measure the initial permeability of ferrimagnetic materials in a frequency range between several MHz and several GHz, wherein a reference toroidal sample made of a nonmagnetic material having a low dielectric constant is placed inside a coaxial line, coaxially between a central conductor and an outside conductor, upstream of an end short circuit; a phase reference loop is placed in the coaxial line in the immediate proximity to the reference sample but outside it; a vectorial voltmeter is used to read voltage Ao on said reference loop, voltage Bo on said measuring loop around the reference sample and the phase shift $\phi_0$ between voltages Ao and Bo for each given frequency of the electromagnetic field; a toroidal sample of the ferrimagnetic material to be analyzed and of the same outside diameter as the reference toroidal sample is substituted for said reference toroidal sample; a vectorial voltmeter is again used to read voltage A1 on said reference loop, voltage B1 on said measuring loop surrounding said sample of ferrimagnetic material to be analyzed and the phase shift $\phi_1$ between voltages A1 and B1, for each given frequency of the electromagnetic field applied to coaxial line; in that the real component $\mu'$ and the imaginary component $\mu''$ of the complex relative initial permeability of the ferrimagnetic material are determined from the formula:

$$\mu' = \frac{Ao}{Bo} \times \frac{B1}{A1} \times K \times \cos(\phi_1 - \phi_0)$$

and $$\mu'' = \frac{Ao}{Bo} \times \frac{B1}{A1} \times K \times \sin(\phi_1 - \phi_0)$$

where K is a dimensionless coefficient equal to or greater than 1, said coefficient representing the ratio between the surface area of the measuring loop and the area of the cross-section of the toroidal sample.

3. A process according to claim 1 adapted to measuring the initial permeability of ferrimagnetic materials in a frequency range between a few Hz and a few MHz, wherein an electric magnetization wire crosses axially through said toroidal sample of ferrimagnetic material to be analyzed; a vectorial voltmeter is used to read the components in phase V" and in quadrature V' of the electromagnetic force measured on said measuring loop consisting of a winding with N turns, for each given frequency F of the signal applied to the electric magnetization wire, and also the reference voltage Vo measured at the terminals of a load connected between said electric magnetization wire and ground; and the real component $\mu'$ and the imaginary component $\mu''$ of the relative initial permeability of the ferrimagnetic material are determined from the formulas:

$$\mu' = \frac{V'}{Vo} \left[ \frac{Z \times 10^{11}}{4\pi \times F \times N \times h \times \log\frac{D}{d}} \right]$$

$$\mu'' = \frac{V''}{Vo} \left[ \frac{Z \times 10^{11}}{4\pi \times F \times N \times h \times \log\frac{D}{d}} \right]$$

where h represents the length of the sample in meters, D and d respectively represent the inside and outside diameters of the toroidal sample and Z represents the impedance of the load in ohms.

4. A device for measuring the initial permeability of ferrimagnetic materials in a frequency range between a few MHz and a few GHz, as a function of temperature, comprising a measuring unit located inside a thermostatically-controlled enslosure and connected (a) to a principal coaxial line fed from a frequency generator, said principal coaxial line having a central conductor and an outside conductor, (b) to first and second secondary coaxial cable which are connected to a vectorial voltmeter, said first secondary coaxial cable having a first central conductor and a first outside conductor and said second secondary coaxial cable having a second central conductor and a second outside conductor and (c) to connecting conductors which are connected to a temperature measuring and regulation circuit for measuring and regulating the temperature of the measuring unit; wherein the measuring unit comprises two semi-cylindrical massive metal half-shells, which are located at the end of the principal coaxial line and are in contact with the outside conductor of the principal coaxial line, or an extension of said outside conductor; means are provided to short circuit the end of the principal coaxial line in the measuring unit; a detachable measuring loop placed in the unit near the short circuiting means is connected to the first central conductor of said first secondary coaxial connecting cable; a reference loop placed in said unit near the detachable measuring loop and having dimensions close to those of the measuring loop is connected to the second central conductor of said second secondary coaxial connecting cable; and said detachable measuring loop is formed so that it can surround a toroidal sample of ferrimagnetic material to be analyzed introduced into said unit coaxially to the principal coaxial line near said short circuiting means while being in contact exclusively with the outside conductor of said principal coaxial line.

5. A device according to claim 4, wherein heating resistors connected to the temperature measuring and regulation circuit and fed with direct current are incorporated in each of the two cylindrical half-shells, parallel to the axis of the principal coaxial line; and temperature measuring sensors are also placed in said half-shells and are connected to said temperature measuring and regulation circuit.

6. A device according to claim 4, wherein length "h" of the toroidal sample that can be placed in said measuring cell near the short circuiting means is of the order of a few millimeters and in any case much less than one-quarter of the wave length of the electromagnetic field existing in the principal coaxial line.

7. A device according to claim 4 wherein the thickness of the outside conductor of the principal coaxial line outside the measuring unit, is reduced.

8. A device according to claim 4 wherein a decoupling bridge is inserted between the principal coaxial line and the frequency generator.

9. A device according to claim 4 wherein the measuring loop is secured in a first cable-clamping block that holds the end of the first secondary coaxial cable, the first outside conductor of said first secondary coaxial cable being in contact with one of the half-shells, while the first central conductor of said first secondary coaxial cable is insulated and connected to a female connector that holds one end of the measuring loop, and the reference loop is secured in a second cable-clamping block that holds the end of the second secondary coaxial cable, the second outside conductor of said second secondary coaxial cable being in contact with the other of the half-shells, while the second central conductor of said second secondary coaxial cable is insulated and connected to a female connector that holds one end of the reference loop.

10. A device according to claim 4, wherein a centering piece in dielectric ceramic is inserted between the outside conductor and the central core of the principal coaxial line near the measuring unit.

11. A device according to claim 4, wherein the reference loop is off-set by 180° to the measuring loop.

12. A device according to claim 4 comprising a microcomputer connected to the frequency generator and to the vectorial voltmeter to automatically control the measuring and recording of permeability of one sample as a function of frequency for a given temperature.

* * * * *